United States Patent
Wanlass

[19]

[11] Patent Number: 5,882,958
[45] Date of Patent: Mar. 16, 1999

[54] DAMASCENE METHOD FOR SOURCE DRAIN DEFINITION OF SILICON ON INSULATOR MOS TRANSISTORS

[76] Inventor: Frank M. Wanlass, 540 Dawn Dr., Sunnyvale, Calif. 94087

[21] Appl. No.: 948,211

[22] Filed: Oct. 9, 1997

Related U.S. Application Data

[63] Continuation-in-part of Ser. No. 922,864, Sep. 3, 1997, abandoned.

[51] Int. Cl.⁶ .................................................. H01L 21/00
[52] U.S. Cl. .......................... 438/149; 438/151; 438/166; 438/300; 438/154
[58] Field of Search .................................. 438/149, 151, 438/166, 300, 154

[56] References Cited

U.S. PATENT DOCUMENTS

| | | | |
|---|---|---|---|
| 3,528,168 | 9/1970 | Adamic | 29/571 |
| 5,116,771 | 5/1992 | Karulkar | 438/300 |
| 5,213,991 | 5/1993 | Inokawa et al. | 438/300 |
| 5,338,697 | 8/1994 | Aoi et al. | 438/300 |
| 5,618,741 | 4/1997 | Young et al. | 438/151 |
| 5,670,398 | 9/1997 | Yin et al. | 438/300 |

*Primary Examiner*—John F. Niebling
*Assistant Examiner*—Lynne A. Gurley

[57] ABSTRACT

The present invention is a technique for producing silicon-on-insulator MOS transistors by damascene patterning of source-drain regions in a thin film of amorphous silicon deposited on a layer of oxide grown on a silicon wafer, where the oxide has previously been etched with a pattern of trenches. In addition, the technique provides for the amorphous layer to contact the underlying silicon substrate through multiple small oxide openings, where subsequent transistor channel regions will align to these openings. After patterning, the wafer is annealed in a high temperature cycle, where the regions of amorphous silicon in contact with the silicon substrate will grow into single crystal silicon suitable for transistor channel regions.

1 Claim, 6 Drawing Sheets

5,882,958

DAMASCENE METHOD FOR SOURCE DRAIN DEFINITION OF SILICON ON INSULATOR MOS TRANSISTORS

This application is a continuation-in-part of Ser. No. 08/922,864, filed Sep. 3, 1997, which is now abandoned.

BACKGROUND OF THE PRESENT INVENTION

1. Field of the Present Invention

The present invention relates to a technique for producing silicon-on-insulator MOS transistors by damascene patterning of a thin film of amorphous silicon deposited on a layer of oxide grown on a silicon wafer, followed by high temperature annealing to form single crystal MOS channel regions.

2. Description of the Prior Art

The primary advantage of using silicon-on-insulator (SOI) substrates, rather than using bulk silicon, for forming MOS transistors has long been recognized as being that of reduced stray capacitance. This allows, of course, higher operating frequencies to be obtained. SOI has other advantages such as better packing density, borderless contacts, latch-up freedom, and radiation hardness.

A thin film of crystalline silicon epitaxially deposited on a polished single crystal aluminum oxide substrate (SOS) was the first composite material to be used for SOI. However, since the crystal properties of aluminum oxide do not perfectly match those of silicon there has always been the problem of reduced yield due to defects in the silicon film.

In recent years SOI circuits have been made by forming a thin film of crystalline silicon on silicon dioxide, where the oxide has been grown on a silicon support wafer. This has enabled the production of silicon films with much lower defect density because the support wafer physical properties, such as thermal expansion coefficient, match those of the silicon film. Currently SOI refers to silicon-on-oxide, which will be our convention.

There are a few different methods for producing SOI substrates; all of which are rather difficult because the silicon film has to be single crystal, and for best performance of the finished circuit, the film should be very thin (less than approximately 1000 Angstroms).

Another difficulty with current SOI is that the MOS transistor body connections are typically left floating for efficiency of chip layout. This can sometimes cause problems. For example, excess charge can remain in a transistor floating body region when attempting to turn a transistor off, which can slow down circuit operation. This problem can be solved by implanting just the right amount of recombination centers in the film; this is difficult to control, because too many centers will degrade the mobility of the film.

It is therefore the object of the present invention to provide a simplified method for producing SOI substrates; and to provide a technique for electrically connecting MOS body regions to well defined voltages without incurring any layout area penalty; and to maintain the high density layout capability of current SOI.

SUMMARY OF THE PRESENT INVENTION

The present invention is a technique for producing silicon-on-insulator MOS transistors by damascene patterning of source-drain regions in a thin film of amorphous silicon deposited on a layer of oxide grown on a silicon wafer, where the oxide has previously been etched with a pattern of trenches. In addition, the invention provides for the amorphous layer to contact the underlying silicon substrate through multiple small oxide openings, where subsequent transistor channel regions will align to these openings. After patterning, the wafer is annealed in a high temperature cycle, where the regions of amorphous silicon in contact with the silicon substrate will grow into single crystal silicon suitable for transistor channel regions.

IN THE DRAWINGS

DETAILED DESCRIPTION OF THE INVENTION

The following is a description of a preferred process flow for making the SOI substrates of this invention, where the thicknesses and dimensions given are representative of modern high resolution masking capabilities, and representative of the requirements of a low voltage logic circuit. Other thicknesses and dimensions can used for different situations.

Figure 1:
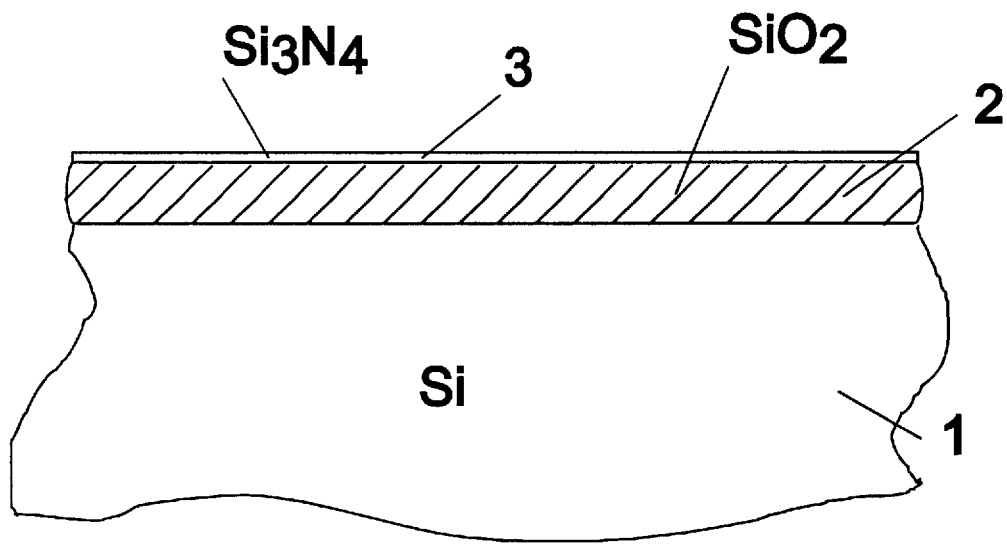
FIG. 1 is a cross section of a starting wafer coated with oxide and nitride.

1. FIG. 1 shows, at the start of the process, a silicon wafer 1 that has grown or deposited onto it silicon dioxide layer 2 with a thickness of 2000 Å, and a very thin layer of silicon nitride 3 deposited on the oxide of 100 Å.

2. The wafer is coated with resist which is exposed, developed and baked into a pattern that will define the location of the SOI transistors.

Figure 2:
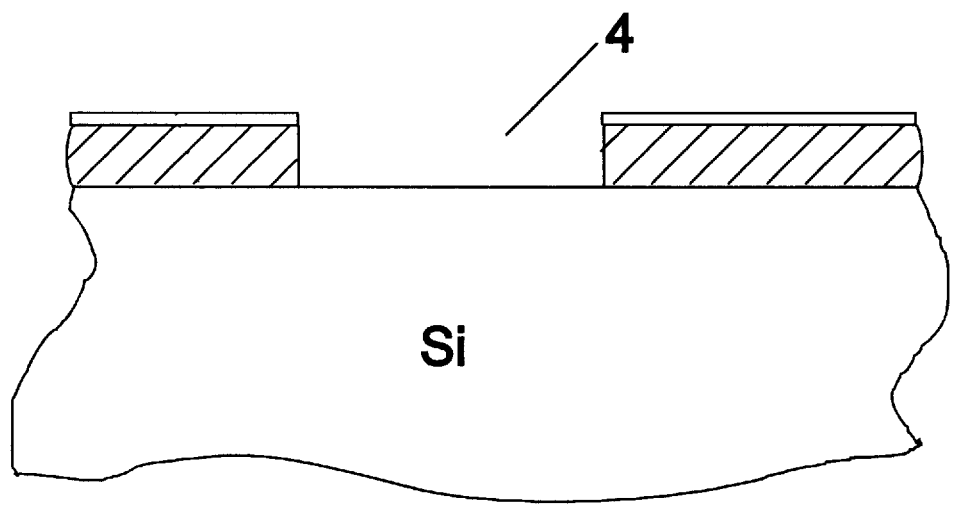
FIG. 2 is a cross section of the first etched opening in the oxide and nitride.

3. Using well known techniques, the nitride is etched followed by an oxide etch to the silicon substrate, followed by resist removal. FIG. 2 shows a cross section view after these steps of one opening 4 of many openings in a typical circuit.

Figure 3:
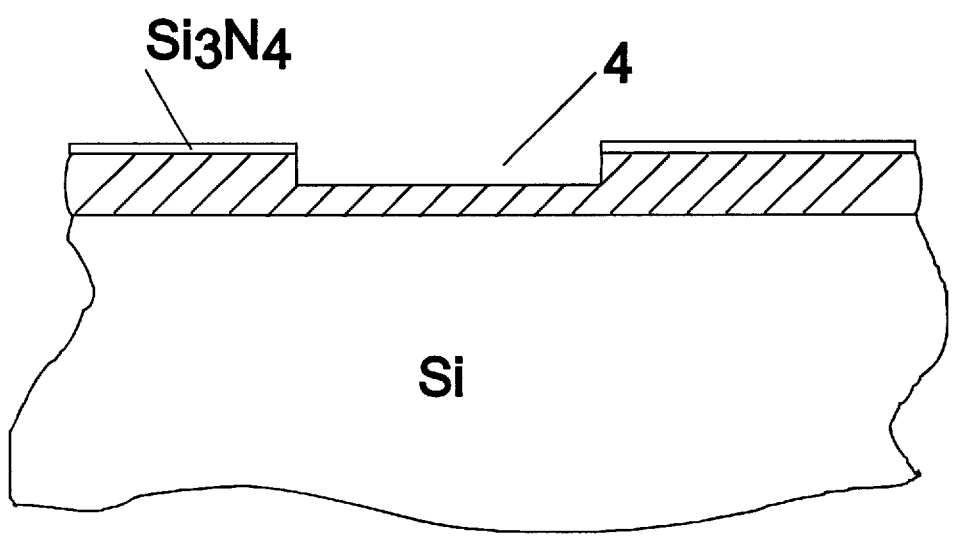
FIG. 3 shows the regrown oxide in the first opening.

4. Oxide is grown to a thickness of 1000 Å in the openings 4 not protected by nitride. FIG. 3 shows this result for one opening.

Figure 4A:
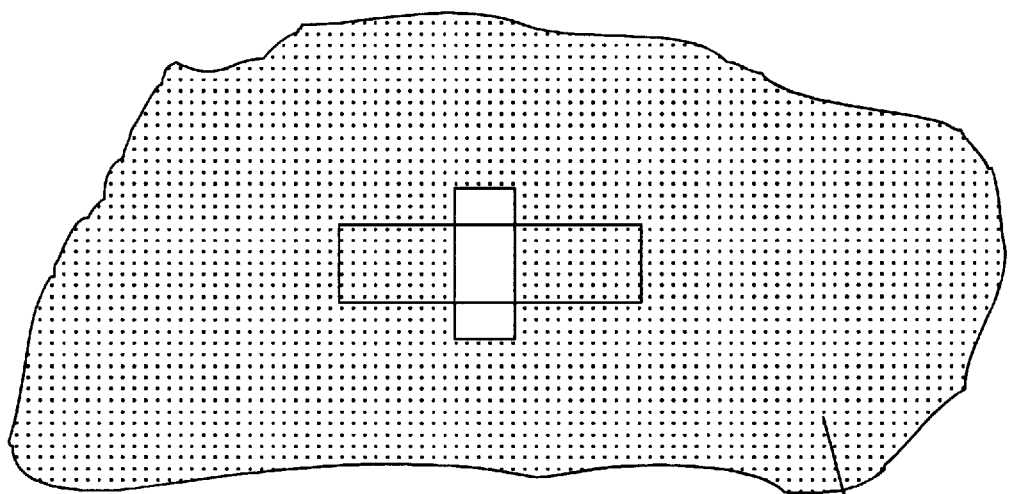
FIG. 4 shows plane and cross section of the resist pattern defining the second opening.
Figure 4B:
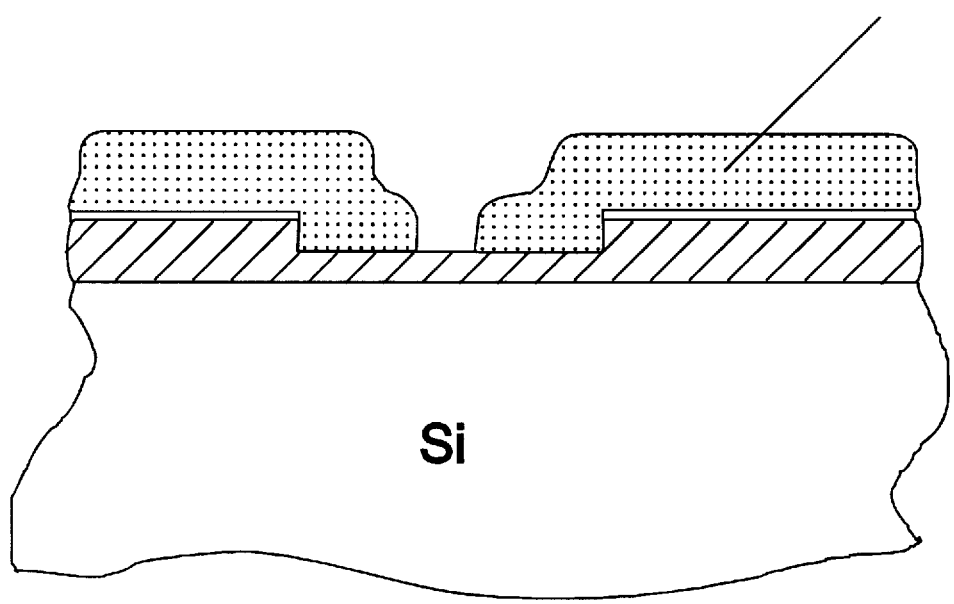

5. The wafer is again coated with resist which is exposed, developed and baked into a pattern that will define openings through the oxide that will later align with transistor channel locations. FIGS. 4A and 4B show the plane view and the cross section view of this patterned resist 5.

Figure 5A:
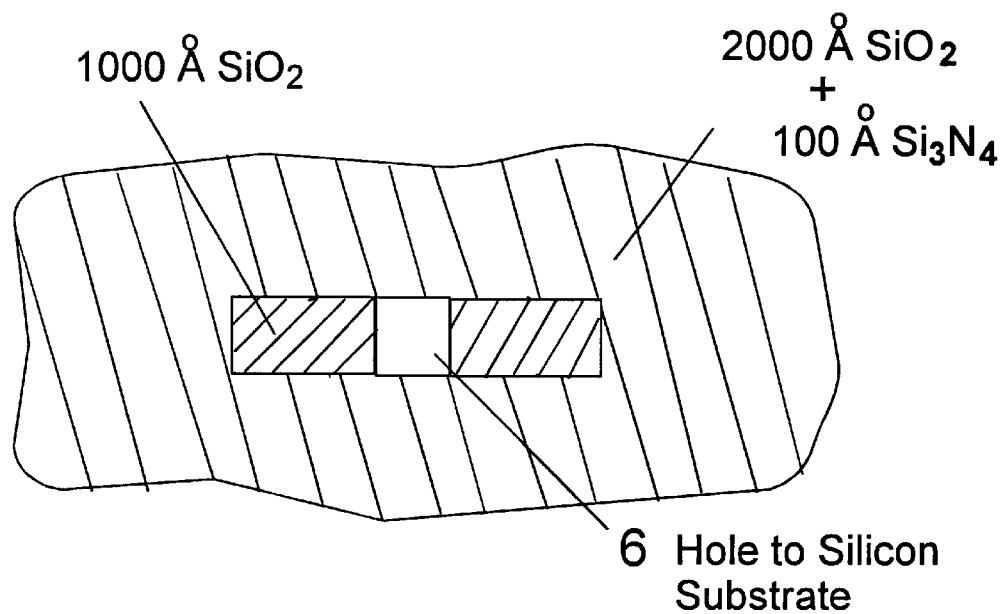
FIG. 5 shows plane and cross section of second opening that will be below the MOS channel region.
Figure 5B:
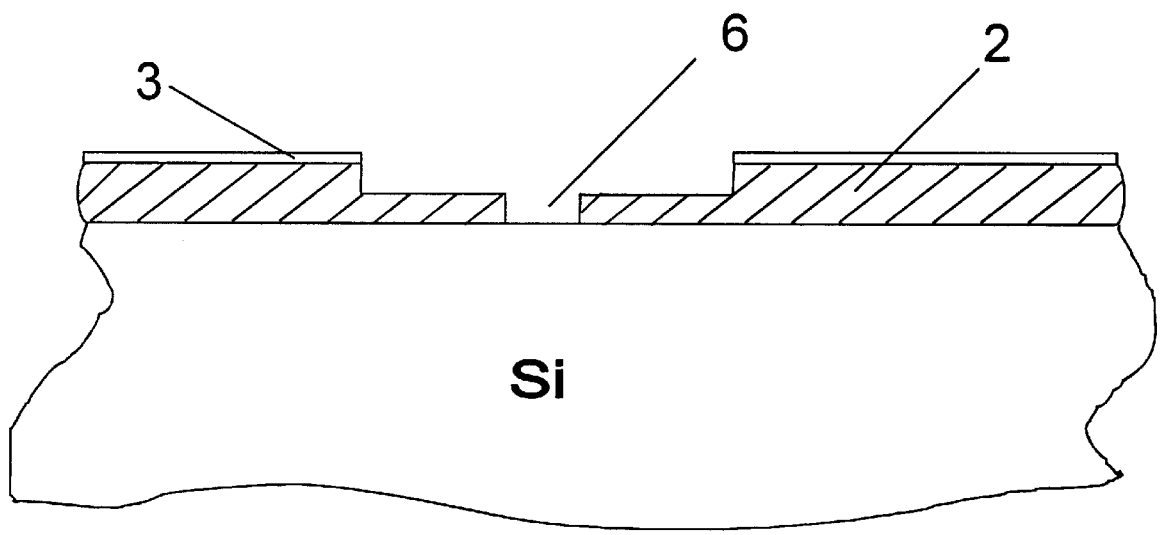

6. The 1000 Å of oxide in the resist opening that is not over nitride is etched, resulting in openings 6 to the silicon of the substrate; this should preferably be an anisotropic plasma etch that etches oxide much faster than silicon or nitride. FIGS. 5A and 5B show the results of this etch after resist removal.

Figure 6:
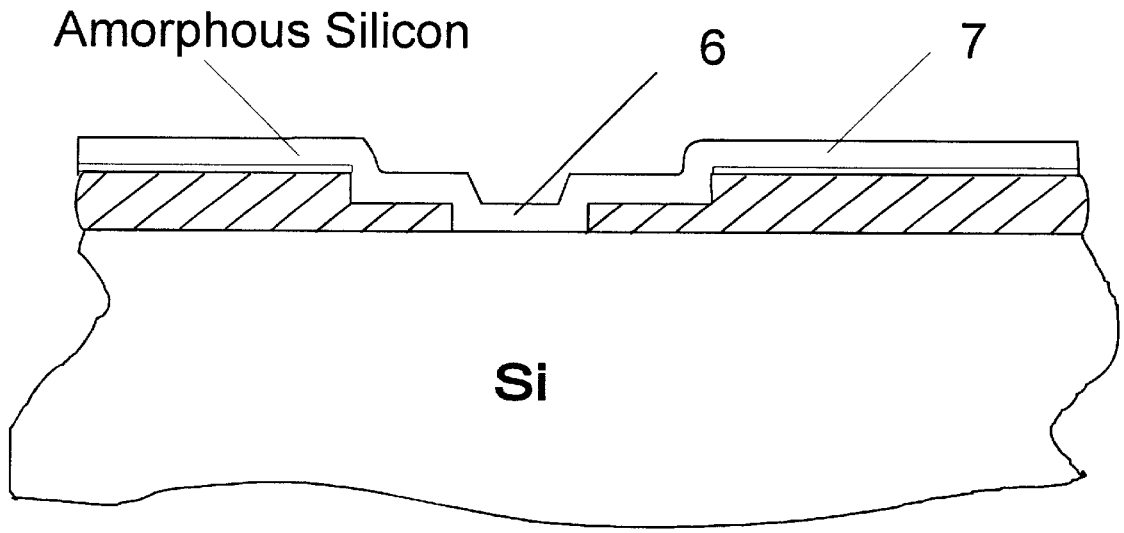
FIG. 6 shows a cross section after amorphous silicon deposition.

7. The wafer is next thoroughly cleaned, placed in a reactor, and a thin layer of approximately 1000 Å of amorphous silicon 7 is deposited. Before depositing silicon, hydrogen gas should be flowed into the reactor to thoroughly remove any residual oxide on the silicon at the bottom of the openings 6, thereby allowing intimate contact of the amorphous silicon to the single crystal silicon in these regions. FIG. 6 shows the results of this operation.

Figure 7:
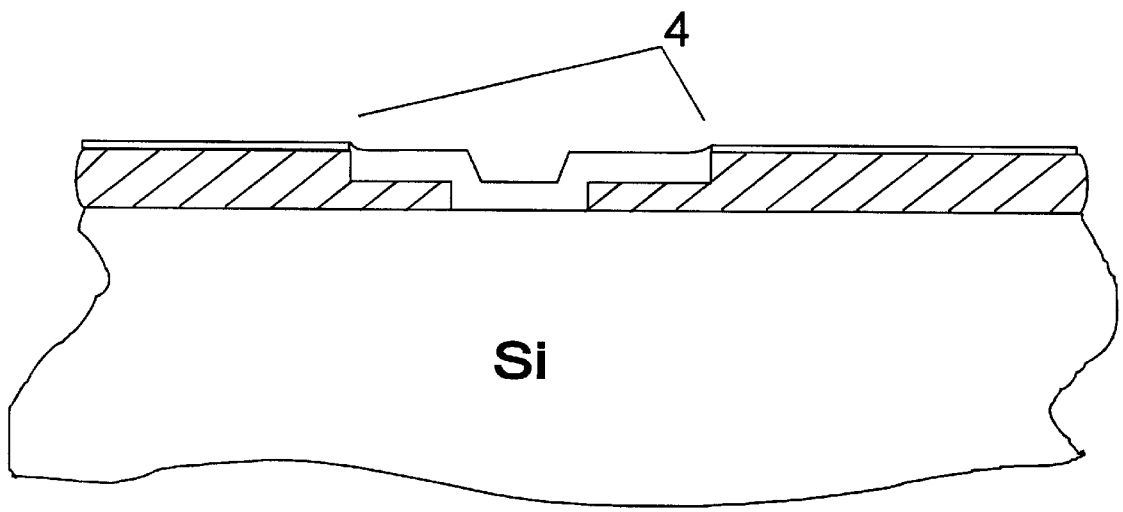
FIG. 7 shows a cross section after chemical-mechanical polishing.

8. The wafer is then chemical-mechanically polished to remove the amorphous silicon, with an etch stop provided by the silicon nitride. This leaves only openings 4 with amorphous silicon, which is approximately level with the top surface of the nitride. FIG. 7 shows the results of this operation.

9. After a thorough cleaning, the wafer is annealed at a temperature and for a time sufficient for the amorphous silicon in openings 6 to convert to single crystal silicon, being seeded by the underlying single crystal silicon substrate.

Figure 8:
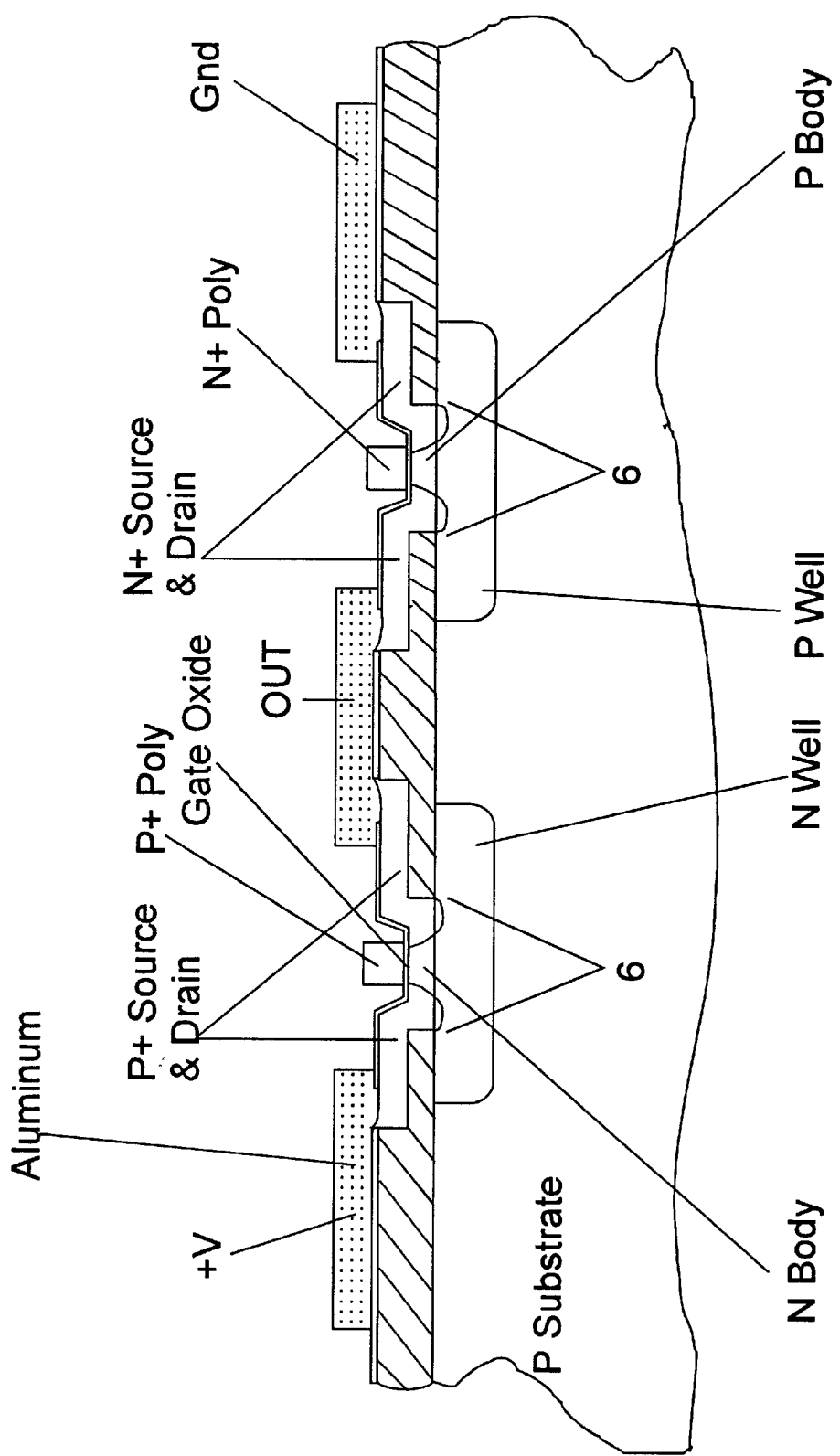
FIG. 8 shows, as an application example that uses this invention's starting material, a cross section of a CMOS inverter, after poly gate and junction definition.

Subsequent processing can proceed using well known procedures. FIG. 8 shows the cross section of the first steps in forming a CMOS inverter pair. The P an N Wells can be implanted before the SOI transistors are formed or after. If formed before, there should be a high temperature step to outdiffuse N dopant from the N Well into the N Body and P dopant from the P Well into the P Body.

The openings 6 in FIG. 8 are somewhat wider than the transistor source-drain spacings. This is to insure, that even with some small misalignment, the transistor regions directly under the Poly gates will be directly over the silicon substrate, thereby insuring these regions will be converted to single crystal silicon during the high temperature amorphous silicon anneal.

The process flow as described results in field regions between transistors having a thickness of 2000 Å. For a modern submicron logic circuit process, with a supply voltage of about 3 volts, and well surface dopings of about $10^{17}$ ions/cm$^3$, this should result in high enough field inversion voltages. Other applications might require a thicker field oxide or need field doping.

FIG. 8 is not quite drawn to scale laterally; openings 6 to the silicon substrate, will typically be less than ⅙ of the transistor areas defined by openings 4, resulting in most of the transistor area positioned over oxide rather than over silicon. This will reduce the capacitance of the source and drain junctions, and will allow source and drain contact openings to aluminum to be made with zero misalignment tolerance. Also, adjacent drains or sources can be spaced very closely without worrying about punchthrough. Even adjacent channel regions can be closely spaced if they are both NMOS or both PMOS.

I claim:

1. A processing method for forming a silicon-on-insulator (SOI) substrate comprised of the following steps:

a) coating a single crystal silicon wafer with a layer of silicon dioxide (SiO$_2$);

b) partially etching large openings in the SiO$_2$ to a depth less than the SiO$_2$ thickness, where each large opening defines the area of an MOS transistor, including source, drain and channel regions;

c) etching a small opening within each large opening, where the small opening is etched completely through to the underlying silicon substrate, and where the small opening is positioned beneath the channel region of the MOS transistor defined by the large opening;

d) depositing amorphous silicon over the SiO$_2$ to a thickness greater than the SiO$_2$ thickness;

e) chemical-mechanical polishing the wafer to remove the amorphous silicon from the surface of the SiO$_2$ except within the large and small openings;

f) heating the silicon wafer to a temperature sufficient to cause crystallization of the amorphous silicon within the small openings.

* * * * *